(12) United States Patent
Li et al.

(10) Patent No.: US 11,764,147 B2
(45) Date of Patent: Sep. 19, 2023

(54) SLIT OXIDE AND VIA FORMATION TECHNIQUES

(71) Applicant: Micron Technology, Inc., Boise, ID (US)

(72) Inventors: Hongqi Li, Boise, ID (US); Kaushik Varma Sagi, Boise, ID (US); Manzar Siddik, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 17/489,262

(22) Filed: Sep. 29, 2021

(65) Prior Publication Data

US 2022/0020685 A1    Jan. 20, 2022

Related U.S. Application Data

(62) Division of application No. 16/256,157, filed on Jan. 24, 2019, now Pat. No. 11,367,681.

(51) Int. Cl.
*H01L 23/522* (2006.01)
*H01L 21/768* (2006.01)

(52) U.S. Cl.
CPC .... *H01L 23/5226* (2013.01); *H01L 21/76877* (2013.01)

(58) Field of Classification Search
CPC .............. H01L 27/24; H01L 27/11512; H01L 27/11507; H01L 27/11514; H01L 23/522;
(Continued)

(56) References Cited

U.S. PATENT DOCUMENTS

2008/0179659 A1   7/2008  Enda et al.
2009/0200679 A1   8/2009  Harada et al.
(Continued)

FOREIGN PATENT DOCUMENTS

JP   2018-534765 A    11/2018
KR   10-0816732 B1    3/2008
WO   2018/151987 A1   8/2018

OTHER PUBLICATIONS

ISA/KR, International Search Report and Written Opinion of the International Searching Authority, Int'l Appl. No. PCT/US2020/013343, dated May 15, 2020, Korean Intellectual Property Office, Seo-gu, Daejeon, Republic of Korea, 10 pgs.

(Continued)

*Primary Examiner* — Chuong A Luu
(74) *Attorney, Agent, or Firm* — Holland & Hart LLP

(57) ABSTRACT

Methods and apparatuses for slit oxide and via formation techniques are described, for example, for fabricating three dimensional memory devices that may include multiple decks of memory cells that each include memory cell stacks and associated access lines. The techniques may create an interconnect region without removing a portion of the memory cell stacks. The interconnect region may include one or more conductive vias extending through the decks of memory cells to couple the access lines with logic circuitry that may be located underneath the decks of memory cells. Further, the techniques may divide an array of memory cells into multiple subarrays of memory cells by forming trenches, which may sever the access lines. In some cases, each subarray of memory cells may be electrically isolated from other subarrays of memory cells. The techniques may reduce a total number of fabrication process steps.

20 Claims, 8 Drawing Sheets

(58) Field of Classification Search
CPC .............. H01L 23/5226; H01L 21/768; H01L 21/76805; H01L 21/76807; H01L 21/76808; H01L 21/76813; H01L 21/76819; H01L 21/76837; H01L 21/76877; H01L 21/76879; H01L 21/76898; H10N 70/00; H10N 70/20; H10N 70/231; H10N 70/826; H10N 70/8825; H10B 63/00; H10B 63/24; H10B 63/84; H10B 53/20; H10B 53/30; H10B 53/50
USPC ........................................................ 257/774
See application file for complete search history.

(56) References Cited

U.S. PATENT DOCUMENTS

| | | | |
|---|---|---|---|
| 2010/0090286 A1 | 4/2010 | Lee et al. | |
| 2012/0001247 A1* | 1/2012 | Alsmeier | H01L 27/11551 |
| | | | 257/314 |
| 2013/0015429 A1 | 1/2013 | Hong et al. | |
| 2013/0264626 A1 | 10/2013 | Sawa | |
| 2015/0162339 A1 | 6/2015 | Divakaruni et al. | |
| 2016/0056129 A1* | 2/2016 | Horibe | H01L 21/308 |
| | | | 438/109 |
| 2016/0343434 A1 | 11/2016 | Lee et al. | |
| 2016/0343726 A1 | 11/2016 | Yune | |
| 2017/0179154 A1 | 6/2017 | Furihata et al. | |
| 2017/0271261 A1 | 9/2017 | Tsutsumi et al. | |
| 2017/0323900 A1 | 11/2017 | Kanamori et al. | |
| 2017/0330887 A1 | 11/2017 | Kim et al. | |
| 2018/0138192 A1 | 5/2018 | Shin et al. | |
| 2018/0233197 A1 | 8/2018 | Laurent | |
| 2018/0358549 A1 | 12/2018 | Bernhardt et al. | |

OTHER PUBLICATIONS

Korean Patent Office, "Notice of Allowance", issued in connection with Korean Patent Application No. 10-2021-7026180 dated Jul. 18, 2022 (4 pages).

Japan Patent Office, "Notice of Rejection Ground", issued in connection with Japan Patent Application No. 2021-542322 dated Sep. 20, 2022 (16 pages).

European Patent Office, "European search report", issued in connection with European Patent Application No. 20744364.9 dated Nov. 25, 2022 (6 pages).

* cited by examiner

SLIT OXIDE AND VIA FORMATION TECHNIQUES

CROSS REFERENCE

The present Application for Patent is a divisional of U.S. patent application Ser. No. 16/256,157 by Li et al., entitled "SLIT OXIDE AND VIA FORMATION TECHNIQUES," filed Jan. 24, 2019, assigned to the assignee hereof, and is expressly incorporated by reference in its entirety herein.

BACKGROUND

The following relates generally to forming a memory array and more specifically to slit oxide and via formation techniques.

Memory devices are widely used to store information in various electronic devices such as computers, wireless communications devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may include volatile memory cells or non-volatile memory cells. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Building more memory cells per unit area may be desired to increase memory cell density and reduce per-bit costs without increasing a size of a memory device. Improved techniques for fabricating memory devices (e.g., faster, lower-cost), including memory devices with increased memory cell density or other beneficial features, may be desired.

DETAILED DESCRIPTION

Figure 1:
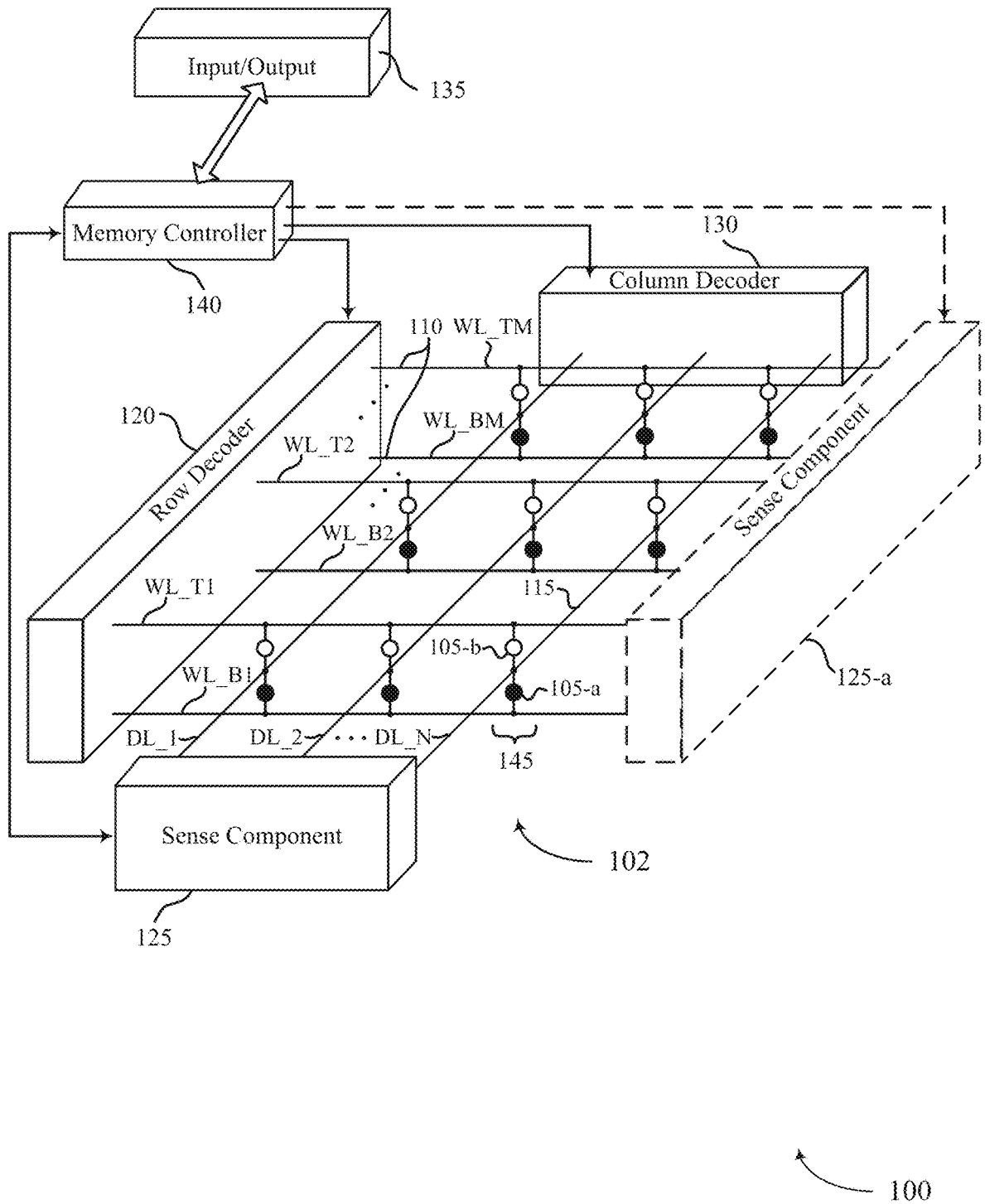
FIG. 1 illustrates an example memory device including a three-dimensional array of memory cells that supports slit oxide and via formation techniques in accordance with embodiments of the present disclosure.

Building more memory cells per unit area may increase areal density of memory cells within a memory device. The increased areal density of memory cells may facilitate a lower per-bit-cost of the memory device and/or a greater memory capacity at a fixed cost. Three-dimensional (3D) integration of two or more two-dimensional (2D) arrays of memory cells may increase areal density while also alleviating difficulties that may be associated with shrinking various feature sizes of memory cells. In some cases, a 2D array of memory cells may be referred to as a deck of memory cells. A memory device including multiple decks of memory cells may be referred to as a 3D memory device. Each deck of memory cells of a 3D memory device may be coupled with logic circuitry that may be configured to perform access operations directed to one or more memory cells of a selected deck. In some cases, the circuitry may include complementary metal oxide semiconductor (CMOS) transistors formed in or on a substrate, and the 3D integrated decks of memory cells may be located above (e.g., fabricated on top of) the CMOS circuitry (which may be referred to as CMOS under the array).

In some cases, a portion of memory cells (e.g., memory cell stacks that include memory cells) and associated access lines within a deck may be removed to create a region (e.g., interconnect region) where one or more conductive vias may extend through one or more decks of memory cells to connect a node of logic circuitry (e.g., CMOS under the array) to an access line within a targeted deck of memory cells located above the logic circuitry. The conductive vias may include a first conductive via connected to a second conductive via that is located below the first conductive via—e.g., a via may be stacked on another via, to create a composite (or connected, merged) via configuration in which the first via extends the second via (e.g., the conductive path associated with the second via) through one or more upper decks that include the first via (e.g., in which the first via is formed).

In some cases, the first conductive via (or the second conductive via) may extend through one or more decks of memory cells. In other cases, a portion of memory cells (e.g., memory cell stacks that include memory cells) and associated access lines within a deck of memory cells may be removed to divide (e.g., slit, sever) an array of memory cells into multiple subarrays of memory cells. As such, each subarray of memory cells may include a lower quantity of memory cells when compared to the array of memory cells. Further, each subarray of memory cells may be electrically isolated from other subarray of memory cells.

In some cases, the portion where the memory cell stacks and associated access lines have been removed may result in undesired features or defects, which may in some cases arise during or otherwise impact subsequent processing steps. As one example, a dielectric material may fill the portion and a first chemical-mechanical planarization (CMP) process step may remove excessive dielectric material above the memory cell stacks. The first CMP process step may create a recess (which may be referred to as dishing) in the portion and the recess may be attributed, at least partially to absence of the memory cell stacks. In some cases, the recess may become more and more pronounced during downstream process steps (e.g., second CMP process step, third CMP process step) such that a surface topography at boundaries of the portion due to the pronounced recess may render a subsequent process step (e.g., tungsten deposition) over the surface topography difficult. Such difficulties in downstream process steps may decrease a die yield within a wafer.

The fabrication techniques, methods, and related devices described herein may facilitate slit oxide and via formation within decks of a 3D memory device (e.g., within array layers collectively including two or more decks of memory cells). As used herein, an access via may refer to an opening or an opening that may be used to form an associated hole or via hole that may be later filled with one or more materials that may be conductive or non-conductive. The fabrication techniques may improve the die yield by alleviating difficulties associated with the recess (e.g., dishing) because the techniques does not require removing memory cells stacks and associated access lines in the interconnect regions. The fabrication techniques may also reduce a manufacturing cost to fabricate 3D memory devices by simplifying (e.g., eliminating process steps associated with removing memory cell stacks and associated access lines) process flow. The simplified process flow may also reduce a raw processing time to fabricate 3D memory devices such that a faster learning cycle using the 3D memory device may be realized during a technology development phase.

As one example, the fabrication techniques may support various cross-point architectures, such as a quilt architecture or its derivatives. A quilt architecture in a context of a memory device may refer to an array of memory cells (e.g., 3D XPoint™ memory cells, FeRAM cells) that includes a set of memory tiles that each include similar configurations of components (e.g., word line decoders, bit line decoders, sense components, a subset of the array of memory cells) similar to the arrangement of patches in a patchwork quilt. The memory tiles may be considered as building blocks (e.g., modular building blocks) for the array of memory cells of the memory device employing the quilt architecture. In this manner, the array of memory cells of the memory device may be expanded or contracted by increasing or decreasing the number of memory tiles.

In other words, a cross-point architecture may refer to a memory array including topological cross-points of first access lines and second access lines, where each topological cross-point corresponds to a memory cell, and a quilt architecture may refer to constructing an array of memory cells by arranging a set of memory tiles that each form a subset of the array. Generally, though described with reference to the example of a memory device, the fabrication techniques described herein may support the fabrication of any integrated circuit (e.g., memory devices of any architecture) in which at least one of vias between layers and isolation or separation of regions within one or more layers is desired.

In some cases, the fabrication techniques may form a hole (e.g., access via, opening, via hole) through a deck of a memory device (e.g., within an interconnect region of the deck) without removing memory cell stacks. In some cases, the hole may expose a conductive via located below the deck. The fabrication techniques may deposit, in the hole, a dielectric material (e.g., oxide, nitride) and remove a portion of the dielectric material from the hole to expose the conductive via located below the deck. In some cases, the fabrication techniques may use a self-aligned contact (SAC) etch process step to remove the portion of the dielectric material from the hole. Subsequently, the fabrication technique may deposit, in the hole, a conductive material (e.g., tungsten, copper) to extend the conductive via through the deck. In some cases, such an interconnect region may include one or more inactive conductive vias (which may alternatively be referred to as dummy vias) that are not coupled with any logic circuitry but may provide various processing benefits (e.g., improved uniformity in patterning process steps or CMP process steps).

Further, the fabrication techniques may form a set of trenches (e.g., boundary regions) through the deck to create one or more electrically floating portions of the deck, where some number of conductive vias may extend through an electrically floating portion of the deck. In some cases, the deck of the memory device includes a set of active memory cell stacks (e.g., within active array regions) and the dielectric material deposited in a hole as part of via formation may be separated from a nearest memory cell stack of the set by a distance that may be less than a pitch of the set of memory cell stacks.

Features of the disclosure introduced above are further described herein in the context of constructing 3D memory devices. Specific examples of structures and techniques for slit oxide and via formation are then described. These and other features of the disclosure are further illustrated by and described with reference to apparatus diagrams, method of formation diagrams, and flowcharts that relate to slit oxide and via formation techniques.

FIG. 1 illustrates an example memory device 100 including a three-dimensional array of memory cells that supports slit oxide and via formation techniques in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100.

In the illustrative example of FIG. 1, the memory device 100 includes a three-dimensional (3D) memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states (e.g., a multi-level cell). A memory cell 105 may, in some embodiments, include various types of memory cells—e.g., a self-selecting memory cell, a 3D XPoint™ memory cell, a PCM cell that includes a storage component and a selection component, a conductive-bridge RAM (CBRAM) cell, or a FeRAM cell. Although some elements included in FIG. 1 are labeled with a numeric indicator, other corresponding elements are not labeled, though they are the same or would be understood to be similar, in an effort to increase the visibility and clarity of the depicted features.

The 3D memory array 102 may include two or more two-dimensional (2D) memory arrays formed on top of one another (e.g., array layers including two or more decks of memory cells and array electrodes). This may increase a number of memory cells that may be placed or created on a single die or substrate as compared with a single 2D array, which in turn may reduce production costs, or increase the performance of the memory device, or both. In the example depicted in FIG. 1, the 3D memory array 102 includes two levels of memory cells 105 (e.g., memory cell 105-a and memory cell 105-b); however, the number of levels may not be limited to two, and other examples may include additional levels (e.g., 4 levels, 8 levels, 16 levels, 32 levels).

Each level may be aligned or positioned so that memory cells 105 may be aligned (exactly, overlapping, or approximately) with one another across each level, thus forming memory cell stacks 145. In some cases, levels of memory cells may be referred to as decks of memory cells.

In some embodiments, each row of memory cells 105 is connected to a word line 110, and each column of memory cells 105 is connected to a bit line 115. Both word lines 110 and bit lines 115 may also be generically referred to as access lines. Further, an access line may function as a word line 110 for one or more memory cells 105 at one deck of the memory device 100 (e.g., for memory cells 105 below the access line) and as a bit line 115 for one or more memory cells 105 at another deck of the memory device (e.g., for memory cells 105 above the access line). Thus, references to word lines and bit lines, or their analogues, are interchangeable without loss of understanding or operation. Word lines 110 and bit lines 115 may be substantially perpendicular to one another and may support an array of memory cells.

In general, one memory cell 105 may be located at the intersection of two access lines such as a word line 110 and a bit line 115. This intersection may be referred to as the address of the memory cell 105. A target memory cell 105 may be a memory cell 105 located at the intersection of an energized (e.g., activated) word line 110 and an energized (e.g., activated) bit line 115; that is, a word line 110 and a bit line 115 may both be energized in order to read or write a memory cell 105 at their intersection. Other memory cells 105 that are in electronic communication with (e.g., connected to, coupled with) the same word line 110 or bit line 115 may be referred to as untargeted memory cells 105.

As shown in FIG. 1, the two memory cells 105 in a memory cell stack 145 may share a common conductive line such as a bit line 115. That is, a bit line 115 may be coupled with the upper memory cell 105-b and the lower memory cell 105-a. Other configurations may be possible, for example, a third layer (not shown) may share a word line 110 with the upper memory cell 105-b.

In some cases, an electrode may couple a memory cell 105 to a word line 110 or a bit line 115. The term electrode may refer to an electrical conductor, and may include a trace, wire, conductive line, conductive layer, or the like that provides a conductive path between elements or components of memory device 100. Thus, the term electrode may refer in some cases to an access line, such as a word line 110 or a bit line 115, as well as in some cases to an additional conductive element employed as an electrical contact between an access line and a memory cell 105. In some embodiments, a memory cell 105 may comprise a chalcogenide material positioned between a first electrode and a second electrode. The first electrode may couple the chalcogenide material to a word line 110, and the second electrode couple the chalcogenide material with a bit line 115. The first electrode and the second electrode may be the same material (e.g., carbon) or different material. In other embodiments, a memory cell 105 may be coupled directly with one or more access lines, and electrodes other than the access lines may be omitted.

Operations such as reading and writing may be performed on memory cells 105 by activating or selecting word line 110 and bit line 115. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the bit line by a selection component. The word line 110 may be connected to and may control the selection component. For example, the selection component may be a transistor and the word line 110 may be connected to the gate of the transistor. Alternatively, the selection component may be a variable resistance component, which may include chalcogenide material. Activating the word line 110 may result in an electrical connection or closed circuit between the logic storing device of the memory cell 105 and its corresponding bit line 115. The bit line may then be accessed to either read or write the memory cell 105. Upon selecting a memory cell 105, the resulting signal may be used to determine the stored logic state. In some cases, a first logic state may correspond to no current or a negligibly small current through the memory cell 105, whereas a second logic state may correspond to a finite current.

In some cases, a memory cell 105 may include a self-selecting memory cell having two terminals and a separate selection component may be omitted. As such, one terminal of the self-selecting memory cell may be electrically connected to a word line 110 and the other terminal of the self-selecting memory cell may be electrically connected to a bit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, the 3D memory array 102 may include multiple word lines 110, labeled WL_1 through WL_M, and multiple bit lines 115, labeled DL_1 through DL_N, where M and N depend on the array size. Thus, by activating a word line 110 and a bit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current through the memory cell 105 may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some embodiments, sense component 125 may read information stored in a selected memory cell 105 by detecting the current flow or lack thereof through the memory cell 105.

Sense component 125 may include various transistors or amplifiers in order to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging sense component 125-a (in a dashed box). An ordinary person skilled in the art would appreciate that sense component 125 may be associated either with column decoder or row decoder without losing its functional purposes.

A memory cell 105 may be set or written by similarly activating the relevant word line 110 and bit line 115, and at least one logic value may be stored in the memory cell 105. Column decoder 130 or row decoder 120 may accept data, for example input/output 135, to be written to the memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state, so the logic state may be re-written after a sense operation. Additionally, in some memory architectures, activating a single word line 110 may result in the discharge of all memory cells in the row (e.g., coupled with the word line 110); thus, several or all memory cells 105 in the row may need to be re-written. But in non-volatile memory, such as self-selecting memory, PCM, CBRAM, FeRAM, or not-AND (NAND) memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltages or currents used during the operation of memory device 100. In general, the amplitude, shape, polarity, and/or duration of an applied voltage or current discussed herein may be adjusted or varied and may be different for the various operations discussed in operating the memory device 100. Further, one, multiple, or all memory cells 105 within the 3D memory array 102 may be accessed simultaneously; for example, multiple or all cells of the 3D memory array 102 may be accessed simultaneously during a reset operation in which all memory cells 105, or a group of memory cells 105, are set to a single logic state.

The 3D memory array 102 may be positioned above a substrate that includes various circuitry, such as the row decoder 120, the sense component 125, the column decoder 130, or the like. In some cases, the 3D memory array 102 may include a set of active array regions each including active memory cell stacks, a set of boundary regions each including a dielectric material and each in contact with a corresponding active array region, and an interconnect region between (e.g., separated from active array regions by at least two boundary regions of the set (e.g., which may wholly or partially surround active array regions). An interconnect region may include at least one memory cell stack configured to electrically float (e.g., inactive memory cell stacks). In some cases, the 3D memory array 102 may include one or more conductive vias located in the interconnect region and coupled with logic circuitry (e.g., row decoder, sense component, column decoder) below the interconnect region, or one or more inactive ("dummy") conductive vias that are not coupled with any logic circuitry but may provide various processing benefits. For example, the dummy vias may assist a robust patterning of features (e.g., holes, lines, trenches) located in close proximity to the dummy vias or improve uniformity of downstream process steps (e.g., CMP process steps).

Figure 2:
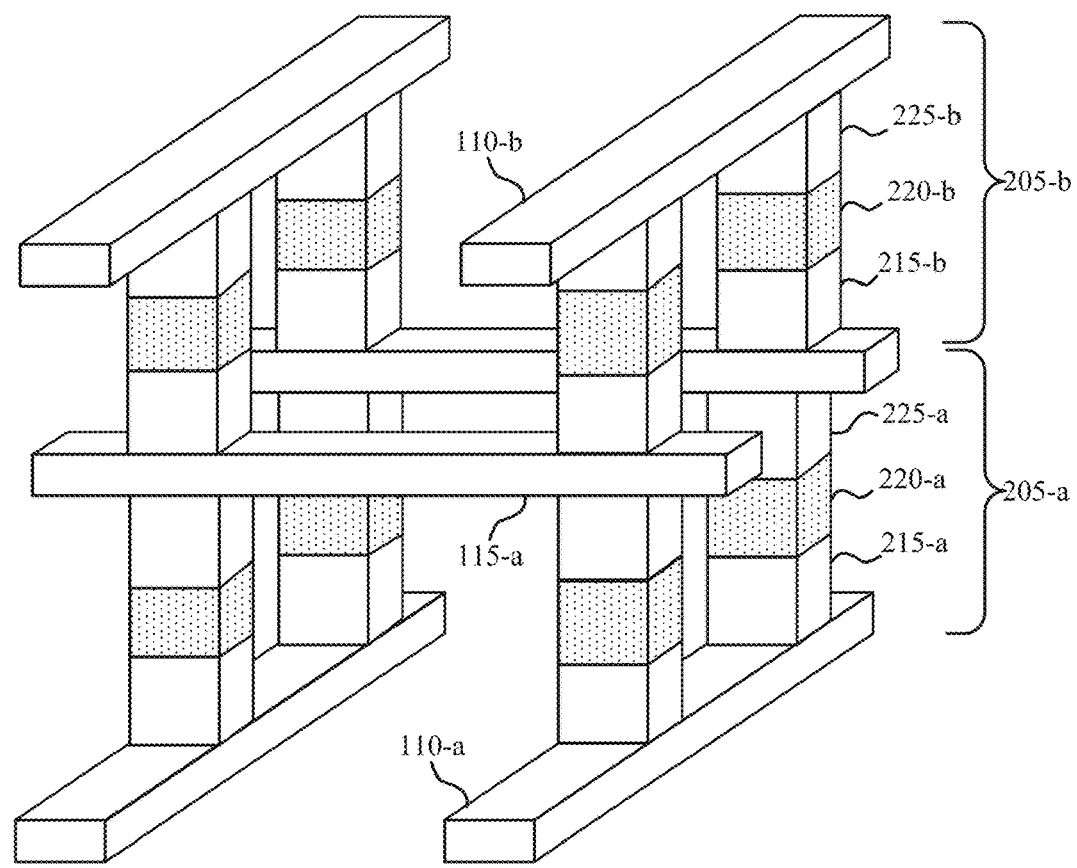
FIG. 2 illustrates an example of a three-dimensional memory array that supports slit oxide and via formation techniques in accordance with embodiments of the present disclosure.

FIG. 2 illustrates an example of a 3D memory array 202 that supports slit oxide and via formation techniques in accordance with embodiments of the present disclosure. The 3D memory array 202 may be an example of portions of 3D memory array 102 described with reference to FIG. 1 or a 3D memory device that includes two or more decks of memory cells. The 3D memory array 202 may include a first array or deck 205-a of memory cells that is positioned above a substrate 204 and a second array or deck 205-b of memory cells on top of the first array or deck 205-a. The 3D memory array 202 may also include word line 110-a and word line 110-b, and bit line 115-a, which may be examples of word lines 110 and a bit line 115 as described with reference to FIG. 1.

As in the illustrative example depicted in FIG. 2, memory cells of the first deck 205-a and the second deck 205-b may each include a self-selecting memory cell. In some examples, memory cells of the first deck 205-a and the second deck 205-b may each include another type of memory cell that may be suitable for a cross-point architecture—e.g., a CBRAM cell, a 3D XPoint™ cell, an FeRAM cell. For example, the memory cells of one or more decks 205 may include an additional selection component (e.g., a transistor or separate chalcogenide element configured for selection functionality). Although some elements included in FIG. 2 are labeled with a numeric indicator, other corresponding elements are not labeled, though they are the same or would be understood to be similar, in an effort to increase the visibility and clarity of the depicted features.

In some cases, memory cells of the first deck 205-a may each include first electrode 215-a, chalcogenide material 220-a, and second electrode 225-a. In addition, memory cells of the second deck 205-b may each include first electrode 215-b, chalcogenide material 220-b, and second electrode 225-b. In some cases, a combination of various materials (e.g., first electrode 215-a, chalcogenide material 220-a, second electrode 225-a) that may form a memory cell (e.g., memory cell 105-a, memory cell 105-b) may be collectively referred to as a memory cell stack. In some embodiments, access lines (e.g., word line 110, bit line 115) may include an electrode layer (e.g., a conformal layer), in lieu of electrodes 215 or 225 and thus may comprise multi-layered access lines. In such embodiments, the electrode layer of the access lines may interface with a memory material (e.g., chalcogenide material 220). In some embodiments, access lines (e.g., word line 110, bit line 115) may directly interface with a memory material (e.g., chalcogenide material 220) without an electrode layer or an electrode in-between.

The memory cells of the first deck 205-a and second deck 205-b may, in some embodiments, have common conductive lines such that corresponding (e.g., vertically aligned in y-direction) memory cells of each deck 205-a and 205-b may share bit lines 115 or word lines 110 as described with reference to FIG. 1. For example, first electrode 215-*b* of the second deck 205-*b* and second electrode 225-*a* of the first deck 205-*a* may both be coupled to bit line 115-*a* such that bit line 115-*a* is shared by vertically aligned and adjacent memory cells (in y-direction).

In some embodiments, the 3D memory array 202 may include an additional bit line (not shown) such that the first electrode 215-*b* of the second deck 205-*b* may be coupled with the additional bit line and the second electrode 225-*a* of the first deck 205-*a* may be coupled with the bit line 115-*a*. The additional bit line may be electrically isolated from the bit line 115-*a* (e.g., an insulating material may be interposed between the additional bit line and the bit line 115-*a*). As a result, the first deck 205-*a* and the second deck 205-*b* may be separated and may operate independently of each other. In some cases, an access line (e.g., either word line 110 or bit line 115) may include a selection component (e.g., a two-terminal selector device, which may be configured as one or more thin-film materials integrated with the access line) for a respective memory cell at each cross-point. As such, the access line and the selection component may together form a composite layer of materials functioning as both an access line and a selection component.

The architecture of 3D memory array 202 may in some cases be referred to as an example of a cross-point architecture, as a memory cell may be formed at a topological cross-point between a word line 110 and a bit line 115 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures. For example, a cross-point architecture may have a $4F^2$ memory cell area, where F is the smallest feature size (e.g., a minimum feature size), compared to other architectures with a $6F^2$ memory cell area, such as those with a three-terminal selection component. For example, a DRAM memory array may use a transistor (e.g., a thin-film transistor), which is a three-terminal device, as the selection component for each memory cell, and thus a DRAM memory array comprising a given number of memory cells may have a larger memory cell area compared to a memory array with a cross-point architecture comprising the same number of memory cells.

While the example of FIG. 2 shows two memory decks, other configurations may include any number of decks (e.g., 4 decks, 8 decks, 16 decks, 32 decks). In some embodiments, one or more of the memory decks may include self-selecting memory cells that include chalcogenide material 220. In other embodiments, one or more of the memory decks may include FeRAM cells that include a ferroelectric material. In yet another embodiments, one or more of the memory decks may include a PCM cell that includes a storage component and a selection component. Chalcogenide materials 220 may, for example, include a chalcogenide glass such as, for example, an alloy of selenium (Se), tellurium (Te), arsenic (As), antimony (Sb), carbon (C), germanium (Ge), and silicon (Si). In some embodiment, a chalcogenide material having primarily selenium (Se), arsenic (As), and germanium (Ge) may be referred to as SAG-alloy. In some cases, word line 110-*a*, word line 110-*b*, and bit line 115-*a* of the 3D memory array 202 may be referred to as access lines or array electrodes.

In some cases, a deck (e.g., first deck 205-*a*) of a memory device may be identified, where the deck includes access lines (e.g., word line 110-*a*, bit line 115-*a*) coupled with memory cell stacks. In some cases, a set of trenches may be formed through the deck to create a portion of the deck that includes electrically floating access line segments (e.g., segments of word line 110-*a*) coupled with electrically floating memory cell stacks. Further, a dielectric material may be deposited in the set of trenches, where the dielectric material may be configured for electrically isolating the electrically floating access line segments (e.g., segments of word line 110-*a*) from other access line segments (e.g., other segments of word line 110-*a*) of the deck. In some cases, a conductive material (e.g., tungsten) may be deposited, above the dielectric material in the set of trenches. Excessive conductive material (and excessive dielectric material in some cases) that may be present above the set of trenches may be removed by using a chemical mechanical polish (CMP) process step or an etch-back process step.

FIGS. 3A-3F illustrate example fabrication techniques that support slit oxide and via formation techniques in accordance with embodiments of the present disclosure. FIGS. 3A-3F describe aspects of several process steps for slit oxide and via formation in an array of memory cells (e.g., first deck 205-*a* including memory cell stacks and access lines that are coupled with the memory cell stacks). In some cases, the slit oxide (e.g., trench 360-*a* filled with a dielectric material, trench 360-*b* filled with a dielectric material and a conductive material, as described herein) may be formed to divide the array of memory cells into multiple subarrays of memory cells as described herein. A region of the array of memory cells where the slit oxide is formed may be referred to as a boundary region. Such a boundary region may surround a subarray of memory cells that are configured to store information—e.g., active array regions including active memory cell stacks. In some cases, the via may be formed to extend through multiple decks of memory cells (e.g., through first deck 205-*a*, second deck 205-*b*, or both) to couple the via with logic circuitry located below the array of memory cells (e.g., one or more decks of memory cells). Such a region of the array of memory cells where the via is formed may be referred to as an interconnect region. The interconnect region of the array may include memory cells (e.g., memory cell stacks) and access lines that are configured to electrically float (e.g., electrically isolated from logic circuitry or any conductive via).

As an illustrative example, FIGS. 3A-3F include cross-sectional side views of a portion of a single deck (e.g., first deck 205-*a* including memory cell stacks and access lines) to illustrate aspects of features during several process steps for the slit oxide and the via formation. Further, FIGS. 3A-3F describe aspects of the several process steps for slit oxide and via formation by forming the holes 345 prior to forming the trenches 360 (e.g., boundary regions) in an array of memory cells.

A person of ordinary skill in the art would appreciate that the techniques described herein is not limited to a single deck. For example, the slit oxide and the via may be formed through two or more decks of memory cells. Further, such a person of ordinary skill in the art would appreciate a particular sequence of forming the vias and the slit oxide (e.g., forming the vias prior to forming the trenches) is not limiting. For example, the trenches 360 may be formed in an array of memory cells to divide the array of memory cells into multiple subarrays of memory cells and create electrically floating portions 365 (e.g., interconnect regions) prior to forming the holes 345, or vice versa.

Figure 3A:
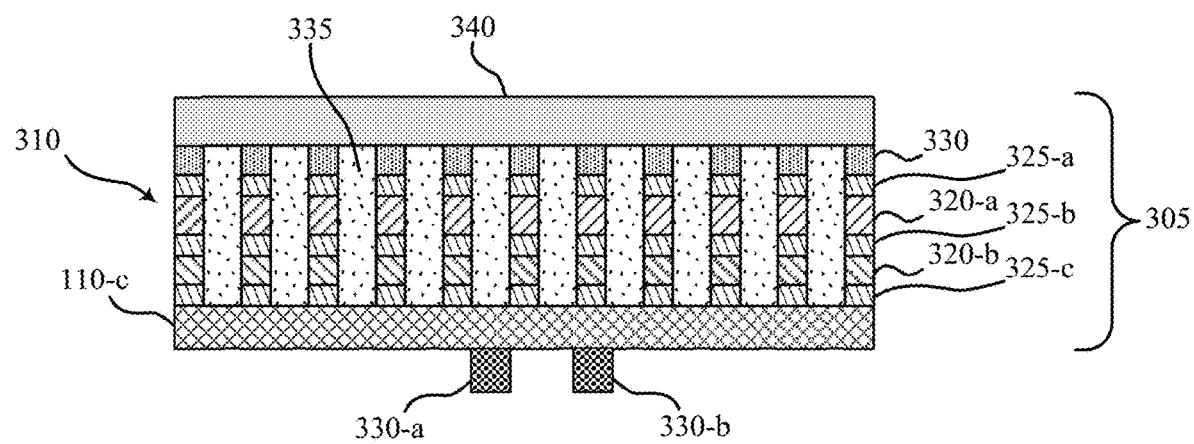
FIGS. 3A through 3F illustrate example fabrication techniques that support slit oxide and via formation techniques in accordance with embodiments of the present disclosure.

FIG. 3A illustrates a cross-sectional side view of a deck 305 of memory cells. The deck 305 may be an example of or include aspects of the decks 205 described with reference to FIG. 2. The deck 305 may include a set of memory cell stacks 310 that each may include a number of different layers of various materials. The deck 305 may include access lines 110 (one of which is depicted in FIG. 3A as a word line 110-c)that are coupled with the set of memory cell stacks 310, which may be an example of or include aspects of word lines 110 described with reference to FIGS. 1 and 2. In some cases, each memory cell stack 310 of the set may correspond to a memory cell. Specific materials of the set of memory cell stacks 310 may be selected based on a number of factors—e.g., a desired kind of memory technology (e.g., self-selecting memory, FeRAM, CBRAM, 3D XPoint™ memory).

In some cases, each memory cell stack 310 may include a conductive material 315, a first chalcogenide material 320-a, a second chalcogenide material 320-b, and an electrode material 325. In some cases, the conductive material 315 may be part of bit lines extending in a substantially perpendicular direction with respect to the word line 110-c. In some cases, the first chalcogenide material 320-a and the second chalcogenide material 320-b may include different chemical compositions to support different functions for the memory cells, respectively—e.g., the first chalcogenide material 320-a supporting a selection function, the second chalcogenide material 320-b supporting storage function, or vice versa. In some cases, the electrode material 325 may facilitate maintaining chemical compositions of the first chalcogenide material 320-a and the second chalcogenide material 320-b during various process steps.

As depicted in FIG. 3A, the set of memory cell stacks 310 may have been formed (e.g., a number of different layers of various materials deposited and patterned) during previous process steps and a dielectric material 335 may have filled spaces between the memory cell stacks 310. In some cases, excessive dielectric material 335 that may be present above the conductive material 315 may have been removed using a CMP process step or an etch-back process step. Subsequently, a sacrificial layer 340 may be formed above the set of memory cell stacks 310 to facilitate various process steps to occur downstream. In some cases, the sacrificial layer 340 may include a nitride material and may be referred to as a cap nitride layer. In some cases, the sacrificial layer 340 may include a hardmask material. In some cases, the sacrificial layer 340 may be removed during the downstream process steps and thus a 3D memory device may include the set of memory cell stacks 310 without the sacrificial layer 340.

FIG. 3A also illustrates conductive vias 330 that may be connected to the access line 110-c. In some cases, the deck 305 may be located above a substrate (e.g., the substrate 204 described with reference to FIG. 2) and the conductive vias 330 may be configured to couple access lines of the deck 305 (e.g., word line 110-c)with logic circuitry in the substrate. In some cases, conductive vias 330 may alternatively be referred to as vias, plugs, or pillars. As an illustrative example, FIG. 3A depicts a single deck 305, in an effort to increase the visibility and clarity of the depicted features but the slit oxide and via formation techniques described herein may support any number of decks (e.g., two decks, four decks, eight decks, sixteen decks) that a 3D memory device may include.

Figure 3B:
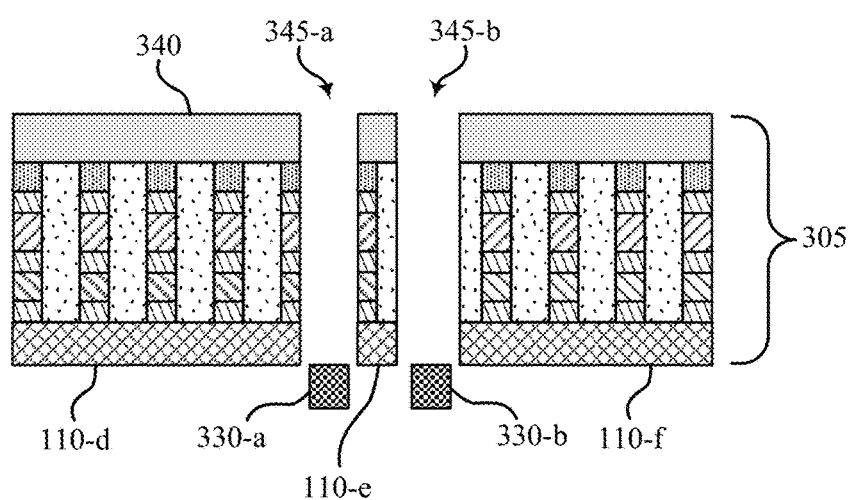

FIG. 3B illustrates a cross-sectional side view of the deck 305 after holes 345 (which may also be referred to as via holes, openings) are formed. In some cases, an anisotropic etch process step may form the holes 345 through the deck 305 above the conductive vias 330 (e.g., conductive via 330-a, conductive via 330-b). As a result, the holes 345 may expose the conductive vias 330 located below the deck 305.

In some cases, a width (or a diameter) of holes 345 may be greater than that of the conductive vias. An anisotropic etch step may remove a target material in one direction (e.g., an orthogonal direction with respect to a substrate) by applying an etchant (e.g., a mixture of one or more chemical elements) to the target material. An anisotropic etch step may use one or more etchants during a single anisotropic etch step when removing one or more layers of materials (e.g., various materials of the memory cell stacks 310 and access line 110-c). In some cases, an anisotropic etch step may use an etchant exhibiting a selectivity targeted to remove a group of materials (e.g., various materials of the memory cell stacks 310 and access line 110-c)while preserving other groups of materials (e.g., photo-resist) exposed to the etchant.

In some cases, the etch process step that forms the holes 345 through the deck 305 may sever an access line (e.g., word line 110-c described with reference to FIG. 3A) included in the deck 305. As a result of the etch process, the access line may be separated into multiple access line segments (e.g., word line segment 110-d, word line segment 110-e, word line segment 110-f). As such, a first access line segment (e.g., word line segment 110-d) may be coaxial with a second access line segment (e.g., word line segment 110-e, word line segment 110-f). Further, the etch process may separate the conductive vias 330 from the access line segments (e.g., word line segment 110-d, word line segment 110-e, word line segment 110-f).

Figure 3C:
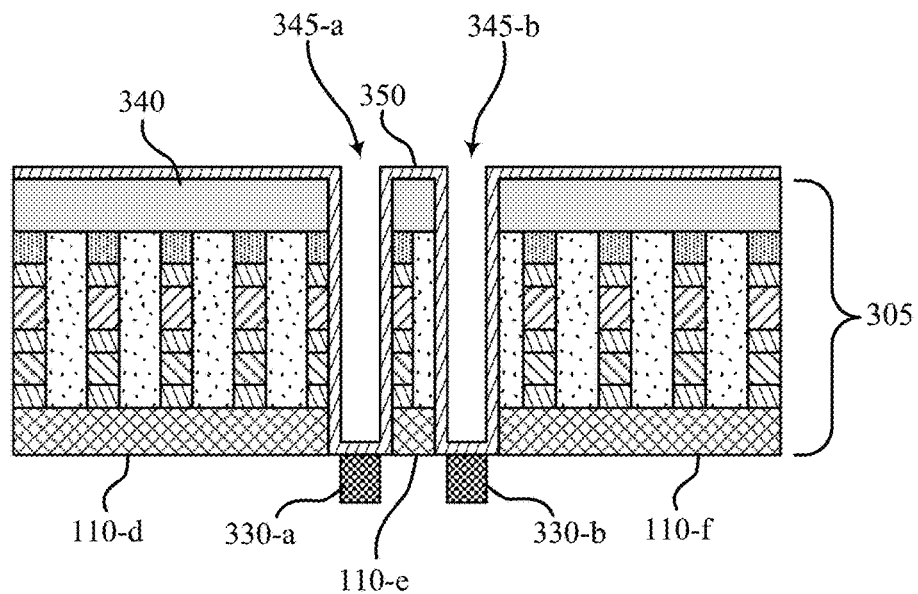

FIG. 3C illustrates a cross-sectional side view of the deck 305 after at least a deposition process step is performed to the deck 305 that include the holes 345 as described with reference to FIG. 3B. In some cases, the deposition process step may deposit a first dielectric material 350 in the holes 345. In some cases, the first dielectric material 350 may be conformal (e.g., maintaining a substantially same thickness) across the horizontal surface (e.g., at the bottom of the holes 345, above the sacrificial layer 340) and the vertical surface (e.g., at the sidewall of the holes 345). In some cases, the first dielectric material 350 may isolate the conductive vias 330 from the access line segments (e.g., word line segment 110-d, word line segment 110-e, word line segment 110-f). In some cases, the first dielectric material 350 may be in contact with the electrically floating access line segments (e.g., word line segment 110-e). In some cases, the deposition process step may include an atomic layer deposition (ALD) process.

Figure 3D:
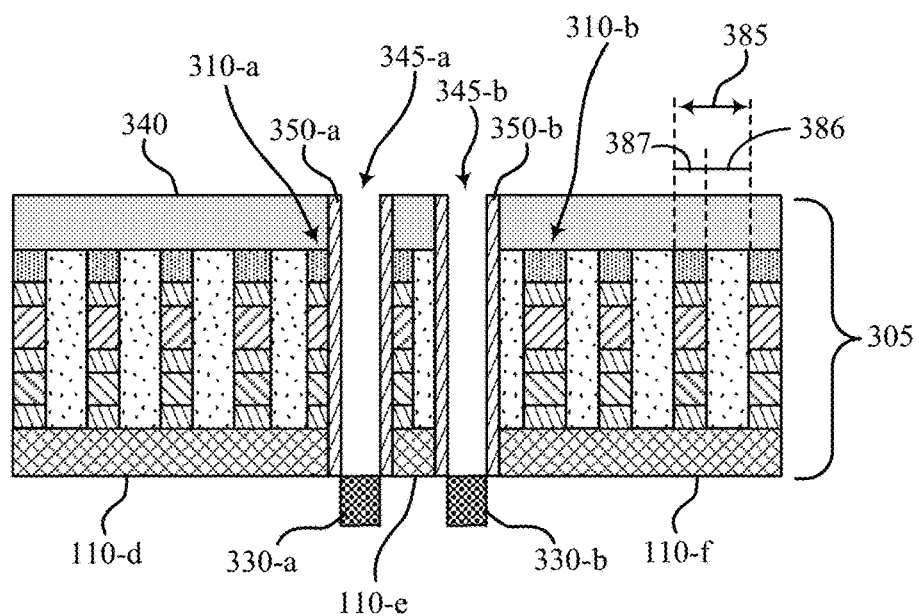

FIG. 3D illustrates a cross-sectional side view of the deck 305 after at least an etch process step is performed to the deck 305 that includes the holes 345 that have been at least partially filled with the first dielectric material 350 as described with reference to FIG. 3C. In some cases, the etch process step may remove the first dielectric material 350 from the horizontal surfaces of the deck 305 (e.g., at the bottom of the holes 345, above the sacrificial layer 340) while substantially maintaining the first dielectric material 350 at the vertical surfaces (e.g., at the sidewall of the holes 345). As such, the etch process step may remove a portion of the first dielectric material 350 from the holes 345 to expose the conductive vias 330 located below the deck 305. In some cases, the etch process step may include an anisotropic etch process step and may be referred to as a self-aligned contact (SAC) etch process. As a result of the etch process step, surface of the conductive vias 330 may be exposed to a subsequent process step while the conductive vias 330 remain to be isolated from the access line segments (e.g., word line segment 110-d, word line segment 110-e, word line segment 110-*f*)—namely, the first dielectric material 350 is located between the conductive vias 330 and the access line segments.

In some cases, the set of memory cell stacks 310 included in the deck 305 may repeat themselves with a pitch 385 that includes a space 386 between memory cell stacks 310 and a width 387 of the memory cell stacks 310. In some cases, the first dielectric material 350 (e.g., the first dielectric material 350-*b*) may be separated from a nearest memory cell stack (e.g., memory cell stack 310-*b*) of the set by a distance that is less than the pitch 385 of the set of memory cell stacks 310. In some cases, the first dielectric material 350 (e.g., the first dielectric material 350-*a*) may be in contact with at least one memory cell stack 310 of the set (e.g., memory cell stack 310-*a*).

Figure 3E:
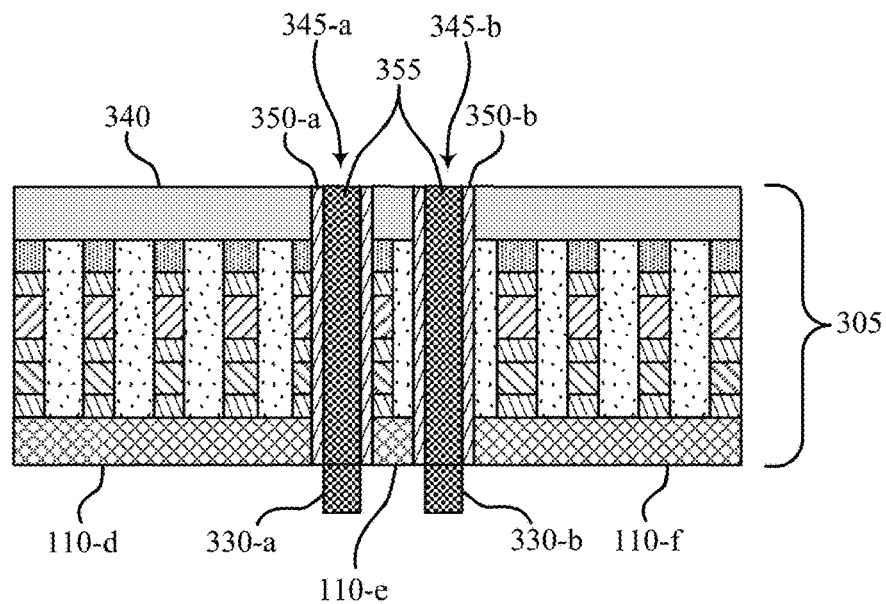

FIG. 3E illustrates a cross-sectional side view of the deck 305 after at least a deposition process step is performed to the deck 305 that includes the holes 345 that have been at least partially filled with the first dielectric material 350 and expose the conductive vias 330 as described with reference to FIG. 3D. In some cases, deposition process may deposit a first conductive material 355 (e.g., tungsten) in the holes 345 to extend the conductive via 330 through the deck 305. In some cases, the first conductive material 355 may be the same material of the conductive vias 330. In some cases, excessive first conductive material 355 present above the sacrificial layer 340 may be removed using a CMP process step or an etch-back process step.

In some cases, one or more additional holes (not shown) may be formed through the deck 305 and may not be aligned with (e.g., located above) any conductive via 330 below the deck 305. Subsequently, the first dielectric material 350 may be deposited in the second hole. In some cases, a portion of the first dielectric material 350 may be removed from the second hole. In some cases, the first conductive material 355 may be deposited in the second hole to form a conductive via that may be electrically isolated from any conductive via located below the deck 305. Such a conductive via may be referred to as an inactive or dummy via, and may provide processing benefits (e.g., robust patterning of nearby features, improved CMP process uniformity) by providing a patterned region as opposed to a blanket region in a given location.

Figure 3F:
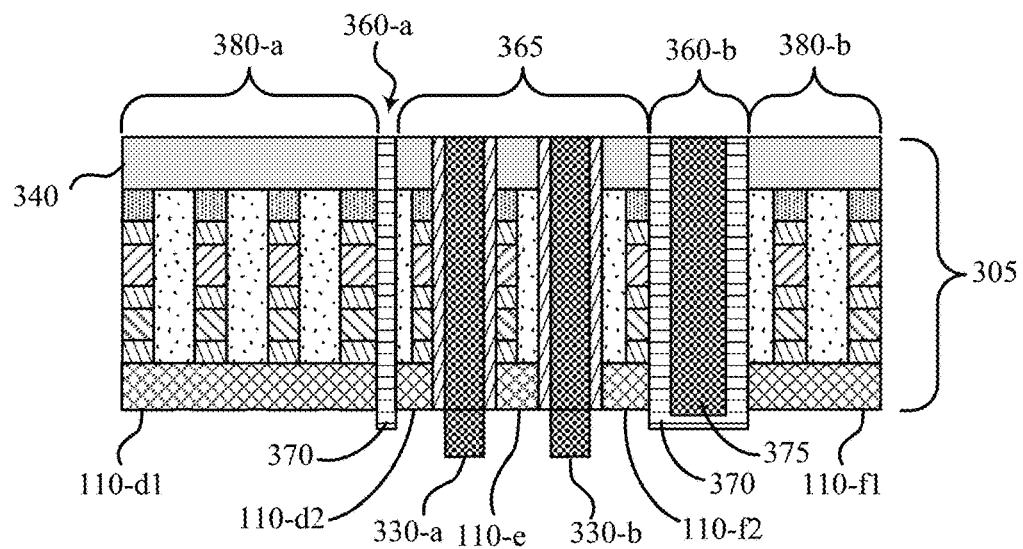

FIG. 3F illustrates a cross-sectional side view of the deck 305 after at least an etch process step and one or more deposition process steps are performed to the deck 305 that includes the conductive vias 330 extending through the deck 305 as described with reference to FIG. 3E. In some cases, the etch process step may form a set of trenches 360 (e.g., trench 360-*a*, trench 360-*b*) through the deck 305 to create an electrically floating portion 365 of the deck 305, where the conductive vias 330 may extend through the electrically floating portion 365 of the deck. The electrically floating portion 365 of the deck 305 including the conductive vias 330 may be referred to as an interconnect region of the array of memory cells. As such, an interconnect region of the array of memory cells may include inactive memory cell stacks that are electrically floating. Further, as a result of the etch process step that forms the set of trenches 360, access lines may be further severed—e.g., word line segment 110-*d* into word line segment 110-*d*1 and word line segment 110-*d*2, word line segment 110-*f* into word line segment 110-*f*1 and word line segment 110-*f*2. As such, the electrically floating portion of the deck may include one or more electrically floating access line segments coupled with one or more electrically floating memory cell stacks.

Subsequently, the deposition step may form a second dielectric material 370 in set of trenches 360. In some cases, the second dielectric material 370 may fill a first subset of the trenches 360 (e.g., trench 360-*a*). The second dielectric material 370 may be the same as the first dielectric material 350. In some cases, the second dielectric material 370 may partially fill a second subset of trenches 360 (e.g., trench 360-*b*). In such cases, the deposition process step may also deposit, above the second dielectric material 370 in the second subset of trenches 360 (e.g., trench 360-*b*), a second conductive material 375 (e.g., tungsten). The second dielectric material 370 may provide for electrically isolating the electrically floating access line segments (e.g., word line segments 110-*d*2, word line segment 110-*e*, word line segment 110-*f*2) from other access line segments of the deck 305 (e.g., word line segment 110-*d*1, word line segment 110-*f*1). In some cases, the second conductive material 375 may be the same as the first conductive material 355, or the conductive material of the conductive vias 330. In some cases, excessive second dielectric material 370 (and second conductive material 375, in some cases) present above the sacrificial layer 340 may be removed using a CMP process step or an etch-back process step.

In some cases, the set of trenches 360 form structures that may be referred to as boundary regions of the array of memory cells. The boundary regions (e.g., the set of trenches 360) may be located between an electrically floating portion 365 (e.g., an interconnect region) and an active array region 380 (e.g., active array region 380-*a*, active array region 380-*b*). In some cases, an active array region 380 may correspond to a portion of the array of memory cells and include memory cell stacks that are configured to store information (e.g., active memory cells). As such, the boundary regions (e.g., trench 360-*b*) may be in contact with a corresponding active array region (e.g., active array region 380-*b*). In some cases, a boundary region (e.g., trench 415-*a* described with reference to FIG. 4) may at least partially surround an active array region (e.g., subarray 410-*a* described with reference to FIG. 4).

In some cases, the electrically floating portion 365 (e.g., an interconnect region) may include a set of access line segments (e.g., word line segments 110-*d*2, word line segment 110-*e*, word line segment 110-*f*2), where each access line segment of the set may be configured to electrically float and at least one access line segment of the set (e.g., word line segments 110-*d*2, word line segment 110-*f*2) may be in contact with a boundary region (e.g., trench 360-*a*, trench 360-*b*). In some cases, a first access line segment (e.g., word line segment 110-*e*) of the set may be coaxial with a second access line segment of the set (e.g., word line segment 110-*f*2).

In some cases, the boundary region (e.g., trench 360-*b*) may include a dielectric material (e.g., second dielectric material 370) and a conductive material (e.g., second conductive material 375), where the dielectric material may be in contact with an active array region (e.g., active array region 380-*b*) and with an interconnect region (e.g., electrically floating portion 365), and the conductive material (e.g., second conductive material 375) may be isolated from the active array region and from the interconnect region by the dielectric material (e.g., second dielectric material 370). As such, the boundary region may include a conductive material surrounded by a dielectric material, where the dielectric material may be configured to render the conductive material electrically floating.

Figure 4:
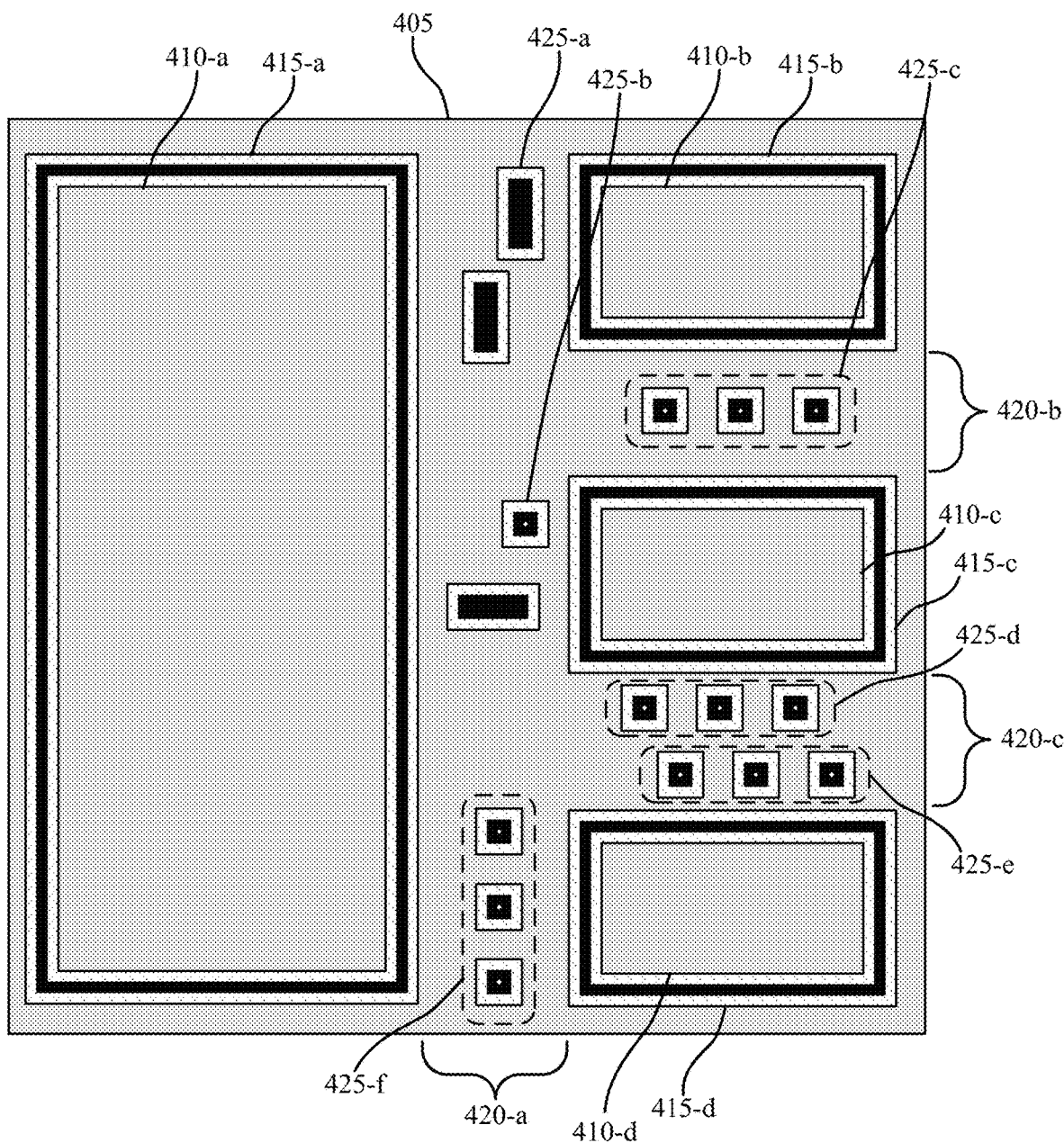
FIG. 4 illustrates an example layout of a three-dimensional memory array that support slit oxide and via formation techniques in accordance with embodiments of the present disclosure.

FIG. 4 illustrates an example layout 400 of a 3D memory array that supports (e.g., may be created using) slit oxide and via formation techniques in accordance with embodiments of the present disclosure. The layout 400 may illustrate aspects of a top-down view of a portion of the 3D memory array, which may be an example of 3D memory array 102 or 3D memory array 202 described with reference to FIGS. 1 and 2. In some cases, the layout 400 may include aspects of a deck of memory cells corresponding to the cross-sectional side view described with reference to FIGS. 3A through 3F. As such, the layout 400 may illustrate a top-down view of the sacrificial layer 340 (depicted as gray squares or rectangles in the layout 400) of FIGS. 3A through 3F. Further, the layout 400 includes an array 405 of memory cells (e.g., a set of memory cell stacks 310 underneath the sacrificial layer 340, as described with reference to FIGS. 3A through 3F). The locations, shapes, and sizes of various structures (e.g., subarrays 410, trenches 415, interconnect regions 420, vias 425 as described herein) depicted in the layout 400 are for illustrative purposes and are not limiting.

The layout 400 illustrates that the array 405 of memory cells, which may be an example of or include aspects of a deck of memory cells (e.g., first deck 205-a, second deck 205-b) described with reference to FIG. 2. The array 405 of memory cells may be divided into subarrays 410 of memory cells by forming one or more trenches 415, in some cases. Subarrays 410 (e.g., subarray 410-a, subarray 410-b, subarray 410-c, subarray 410-d) may be of various sizes and shapes that may be based on a specified function or a desired capacity of each subarray 410. The layout 400 also illustrates interconnect regions 420, which may be examples of one or more electrically floating portions 365 as described with reference to FIGS. 3A through 3F. An interconnect region 420 (e.g., interconnect region 420-b) may be located between two trenches (e.g., trench 415-b and trench 415-c). In some cases, the interconnect region 420 may include one or more vias (e.g., vias 425-c).

In some cases, the 3D memory array may include a set of active array regions each including active memory cell stacks, a set of boundary regions each including a dielectric material and each in contact with a corresponding active array region, and an interconnect region between at least two boundary regions of the set, where the interconnect region may include at least one memory cell stack configured to electrically float. In some cases, a boundary region of the set may at least partially surround an active array region of the set.

The layout 400 illustrates the trenches 415 (which may be examples of trenches 360 described with reference to FIGS. 3A through 3F) and the vias 425 (which may be examples of holes 345 described with reference to FIGS. 3A through 3F). In some cases, the trenches 415 may include a dielectric material (e.g., the second dielectric material 370 described with reference to FIGS. 3A through 3F), which is depicted as features with a dotted pattern in FIG. 4.

In other cases, the trenches 415 may also include a conductive material (e.g., the second conductive material 375 described with reference to FIGS. 3A through 3F), which is depicted as features with a black pattern in FIG. 4, in addition to the dielectric material. In some cases, the vias 425 may include a second dielectric material (e.g., the first dielectric material 350 described with reference to FIGS. 3A through 3F, depicted as features with the dotted pattern in FIG. 4) and a second conductive material (e.g., the first conductive material 355 described with reference to FIGS. 3A through 3F, depicted as features with the black pattern in FIG. 4).

The vias 425 may be configured to have various shapes and sizes. For example, the vias may have a rectangular shape (e.g., via 425-a) or a square shape (e.g., via 425-b). The vias 425 may have a substantially rounded corners that may be attributed to at least a resolution limit associated with process steps (e.g., photolithography process step, etch process step) associated with forming the vias 425. In some cases, the vias 425 may include conductive vias (e.g., conductive vias 330 described with reference to FIGS. 3A through 3F) that are coupled with logic circuitry. In some cases, some conductive vias may be configured to electrically float. The vias 425 may also include conductive vias that are electrically isolated from any conductive via (or the logic circuitry)—e.g., inactive vias, dummy vias. In some cases, the 3D memory array may include a conductive via (e.g., via 425-a, via 425-b) located in the interconnect region (e.g., interconnect region 420-a) and coupled with logic circuitry below the interconnect region. Further, the conductive via (e.g., via 425-a, via 425-b) may be at least partially surrounded by a dielectric material configured to isolate the conductive via from an access line segment as described with reference to FIGS. 3A through 3F. In some cases, an interconnect region 420 or a subset region therein may include only so-called dummy vias, such as for processing benefits.

In some cases, the 3D memory array may include a set of vias aligned in a row (e.g., vias 425-c, vias 425-d, vias 425-e, vias 425-f). In some cases, the conductive via (e.g., the conductive via located in the middle of vias 425-c) may be located between a second conductive via and a third conductive via (e.g., the conductive vias at both ends of the vias 425-c) and the second conductive via and the third conductive via each may be configured to electrically float.

In some cases, a first row of conductive vias (e.g., vias 425-d) that are at least partially surrounded by a second dielectric material may be located in the interconnect region (e.g., interconnect region 420-c), where at least a subset of conductive vias in the first row (e.g., a conductive via located in the middle of the vias 425-d) may be coupled with logic circuitry below the interconnect region. In some cases, a second row of conductive vias (e.g., vias 425-e) that are at least partially surrounded by the second dielectric material may be located in the interconnect region (e.g., interconnect region 420-c), where the second row of conductive vias (e.g., vias 425-e) may be substantially parallel with the first row of conductive vias (e.g., vias 425-d), and where at least a subset of conductive vias in the second row (e.g., a conductive via located in the middle of the vias 425-d) may be coupled with the logic circuitry below the interconnect region (e.g., interconnect region 420-c).

In some cases, a portion of interconnect region (e.g., interconnect region 420-a) may include one or more vias (e.g., vias 425-f), where the one or more vias (e.g., three vias of the vias 425-f) may be configured to form conductive vias that are electrically isolated from any conductive via located below a deck of memory cells. In some cases, such vias (e.g., inactive vias, dummy vias) may facilitate (e.g., assist) forming of adjacent features (e.g., trench 415-a, trench 415-d) without compromising integrity of the adjacent features—e.g., widths or linearity of the trench patterns. For example, the dummy vias (e.g., vias 425-f) may assist a robust patterning of features located in close proximity to the dummy vias (e.g., trench 415-a, trench 415-b). Additionally or alternatively, the dummy vias (e.g., vias 425-f) may improve uniformity of a downstream process step (e.g., CMP process step) by providing a patterned region as opposed to a blanket region in a given location—e.g., the location including vias 425-f, trench 415-a, trench 415-b.

In some cases, the subarrays 410 may be referred to as active array regions that each include active memory cell stacks (e.g., memory cell stacks that form memory cells to store information). In some cases, the trenches 415 may be referred to as boundary regions that each may include a dielectric material and each may be in contract with a corresponding active array region. For example, the trench 415-a includes a dielectric material and is in contact with the subarray 410-a. Further, the trench 415-b includes a dielectric material and is in contact with the subarray 410-b. In some cases, an interconnect region (e.g., interconnect region 420-a, interconnect region 420-b, interconnect region 420-c)may be located between at least two boundary regions (trench 415-a, trench 415-b, trench 415-c) and the interconnect region may include at least one memory cell stack configured to electrically float (e.g., an inactive memory cell, a memory cell stack that is not coupled with an access line coupled with logic circuitry).

Figure 5:
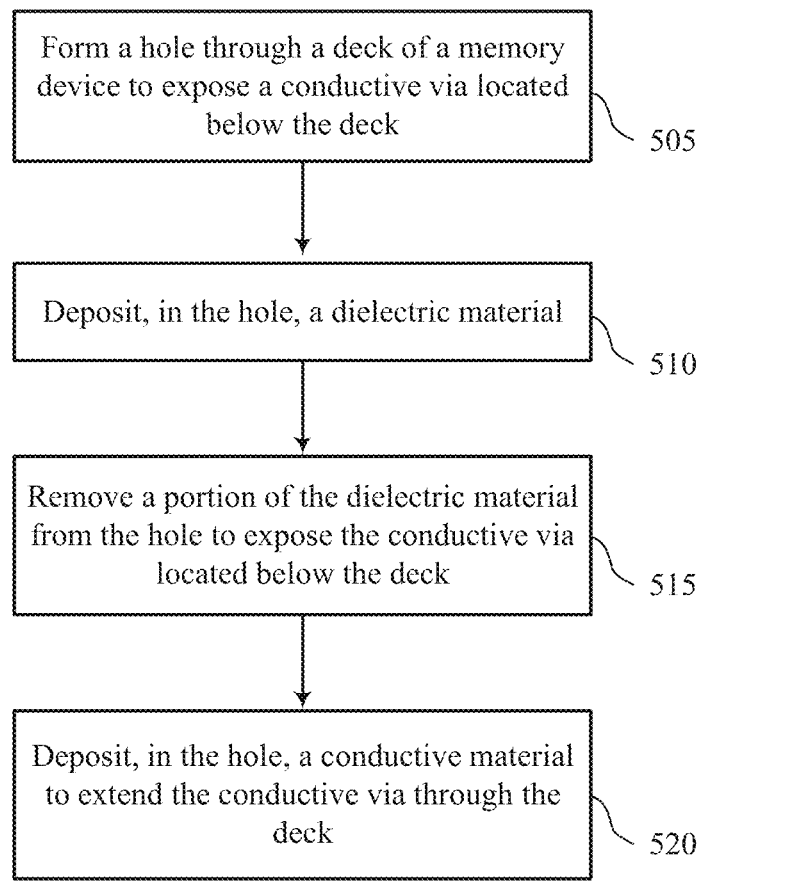
FIGS. 5 and 6 illustrate methods that support slit oxide and via formation techniques in accordance with embodiments of the present disclosure.

FIG. 5 illustrates a method 500 that support slit oxide and via formation techniques in accordance with embodiments of the present disclosure. The operations of method 500 may be implemented by the method described herein, for example with reference to FIGS. 3A-3F and 4.

At block 505 a hole may be formed through a deck of a memory device to expose a conductive via located below the deck. The operations of block 505 may be performed according to the methods described herein. In certain examples, aspects of the operations of block 505 may be performed as part of one or more processes as described with reference to FIGS. 3A-3F and 4.

At block 510 a dielectric material may be deposited in the hole. The operations of block 510 may be performed according to the methods described herein. In certain examples, aspects of the operations of block 510 may be performed as part of one or more processes as described with reference to FIGS. 3A-3F and 4.

At block 515 a portion of the dielectric material may be removed from the hole to expose the conductive via located below the deck. The operations of block 515 may be performed according to the methods described herein. In certain examples, aspects of the operations of block 515 may be performed as part of one or more processes as described with reference to FIGS. 3A-3F and 4.

At block 520 a conductive material may be deposited to extend the conductive via through the deck. The operations of block 520 may be performed according to the methods described herein. In certain examples, aspects of the operations of block 520 may be performed as part of one or more processes as described with reference to FIGS. 3A-3F and 4.

In some cases, the method 500 may also include forming a set of trenches through the deck to create an electrically floating portion of the deck, where the conductive via extends through the electrically floating portion of the deck. In some examples of the method 500 described herein, the electrically floating portion of the deck may include one or more electrically floating access line segments coupled with one or more electrically floating memory cell stacks. In some examples of the method 500 described herein, the dielectric material may be in contact with at least one of the one or more electrically floating access line segments.

In some cases, the method 500 may also include depositing, in the set of trenches, a second dielectric material to at least partially fill the set of trenches. In some cases, the method 500 may also include depositing, above the second dielectric material in the set of trenches, a second conductive material. In some examples of the method 500 described herein, forming the hole through the deck may also include severing an access line included in the deck.

In some examples of the method 500 described herein, the deck of the memory device may include a set of memory cell stacks and the dielectric material may be separated from a nearest memory cell stack of the set by a distance that is less than a pitch of the set of memory cell stacks. In some examples of the method 500 described herein, the dielectric material may be in contact with at least one memory cell stack of the set. In some cases, the method 500 may also include forming a second hole through the deck, depositing, in the second hole, the dielectric material, removing a portion of the dielectric material from the second hole, and depositing, in the second hole, the conductive material to form a conductive via that is electrically isolated from any conductive via located below the deck.

Figure 6:
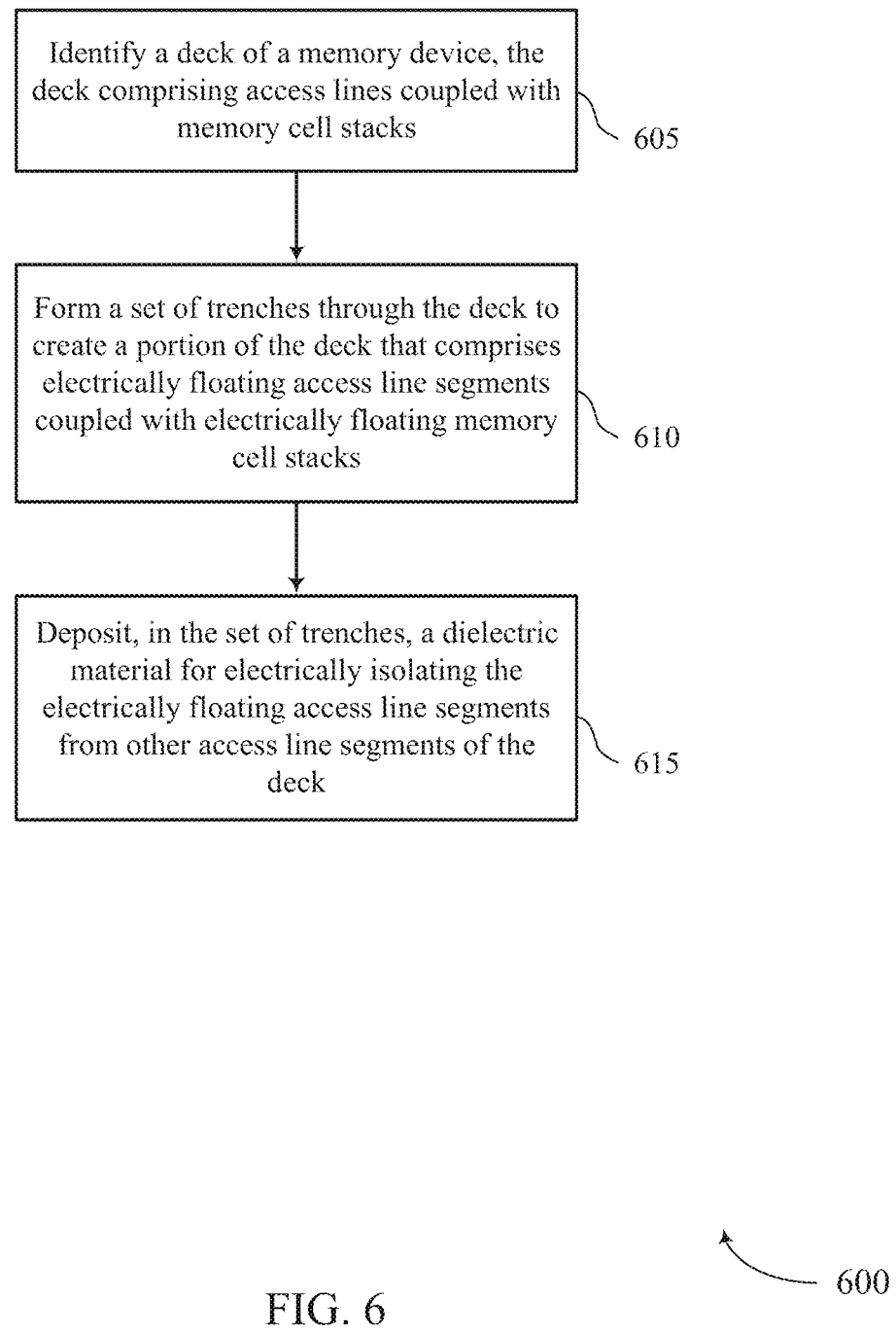

FIG. 6 illustrates a method 600 that support slit oxide and via formation techniques in accordance with embodiments of the present disclosure. The operations of method 600 may be implemented by the method described herein, for example with reference to FIGS. 3A-3F and 4.

At block 605 a deck of a memory device may be identified, where the deck may include access lines coupled with memory cell stacks. The operations of block 605 may be performed according to the methods described herein. In certain examples, aspects of the operations of block 605 may be performed as part of one or more processes as described with reference to FIGS. 3A-3F and 4.

At block 610 a set of trenches may be formed through the deck to create a portion of the deck that may include electrically floating access line segments coupled with electrically floating memory cell stacks. The operations of block 610 may be performed according to the methods described herein. In certain examples, aspects of the operations of block 610 may be performed as part of one or more processes as described with reference to FIGS. 3A-3F and 4.

At block 615 a dielectric material may be deposited in the set of trenches for electrically isolating the electrically floating access line segments from other access line segments of the deck. The operations of block 615 may be performed according to the methods described herein. In certain examples, aspects of the operations of block 615 may be performed as part of one or more processes as described with reference to FIGS. 3A-3F and 4.

In some cases, the method 600 may also include depositing, above the dielectric material in the set of trenches, a conductive material. In some cases, the method 600 may also include forming a hole through the portion of the deck to expose a conductive via located below the electrically floating access line segments. In some cases, the method 600 may also include depositing, in the hole, a second dielectric material to partially fill the hole, removing a portion of the second dielectric material from the hole to expose the conductive via located below the electrically floating access line segments, and depositing, in the hole, a second conductive material to extend the conductive via through the deck.

It should be noted that the methods described herein describe possible implementations, and that the operations and the steps may be rearranged or otherwise modified and that other implementations are possible. Further, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

Chalcogenide materials may be materials or alloys that include at least one of the elements S, Se, and Te. Chalcogenide materials may include alloys of S, Se, Te, Ge, As, Al, Si, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory components of the memory cells. For example, other examples of variable resistance materials can be used to form memory components and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a four terminal device including a source, drain, gate, and body (or substrate). The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel that may be part of the body. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such a configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, read only memory (ROM), electrically erasable programmable ROM (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a plurality of active array regions each comprising active memory cell stacks;
a plurality of boundary regions each comprising a dielectric material and each in contact with a corresponding active array region; and
an interconnect region between at least two boundary regions of the plurality, the interconnect region different than the plurality of active array regions and comprising at least one memory cell stack configured to electrically float.

2. The apparatus of claim 1, further comprising:
a conductive via located in the interconnect region and coupled with logic circuitry below the interconnect region.

3. The apparatus of claim 2, wherein the conductive via is at least partially surrounded by a second dielectric material configured to isolate the conductive via from an access line segment.

4. The apparatus of claim 2, further comprising:
a second conductive via and a third conductive via each configured to electrically float, wherein the conductive via, the second conductive via, and the third conductive via are aligned in a row with the conductive via located between the second conductive via and the third conductive via.

5. The apparatus of claim 1, further comprising:
a plurality of access line segments in the interconnect region, each access line segment of the plurality configured to electrically float and at least one access line segment of the plurality in contact with a boundary region of the plurality.

6. The apparatus of claim 5, wherein a first access line segment of the plurality is coaxial with a second access line segment of the plurality.

7. The apparatus of claim 1, wherein a boundary region of the plurality at least partially surrounds an active array region of the plurality.

8. The apparatus of claim 7, wherein the boundary region of the plurality comprises the dielectric material and a conductive material, the dielectric material in contact with the active array region of the plurality and with the interconnect region, and the conductive material isolated from the active array region and from the interconnect region by the dielectric material.

9. The apparatus of claim 1, further comprising:
a first row of conductive vias at least partially surrounded by a second dielectric material and located in the interconnect region, wherein at least a subset of conductive vias in the first row are coupled with logic circuitry below the interconnect region.

10. The apparatus of claim 9, further comprising:
a second row of conductive vias at least partially surrounded by the second dielectric material and located in the interconnect region, wherein the second row of conductive vias is substantially parallel with the first row of conductive vias, and wherein at least a second subset of conductive vias in the second row are coupled with the logic circuitry below the interconnect region.

11. The apparatus of claim 9, wherein at least a second subset of conductive vias in the first row are configured to electrically float.

12. The apparatus of claim 1, further comprising:
a conductive via located in the interconnect region and electrically isolated from any conductive via located below the interconnect region.

13. An apparatus, comprising:
a plurality of active array regions each comprising active memory cell stacks;
a plurality of boundary regions each comprising a dielectric material and each in contact with a corresponding active array region; and
an interconnect region between at least two boundary regions of the plurality, the interconnect region different than the plurality of active array regions and comprising a plurality of access line segments each configured to electrically float and at least one access line segment of the plurality in contact with a boundary region of the plurality.

14. The apparatus of claim 13, further comprising:
a conductive via located in the interconnect region and electrically isolated from any conductive via located below the interconnect region.

15. The apparatus of claim 13, further comprising:
a conductive via located in the interconnect region and coupled with logic circuitry below the interconnect region.

16. The apparatus of claim 13, wherein a boundary region of the plurality at least partially surrounds an active array region of the plurality.

17. An apparatus, comprising:
a plurality of active array regions each comprising active memory cell stacks;
a plurality of boundary regions each comprising a dielectric material and each in contact with a corresponding active array region; and
an interconnect region between at least two boundary regions of the plurality, the interconnect region different than the plurality of active array regions and comprising a conductive via electrically isolated from any conductive via located below the interconnect region.

18. The apparatus of claim 17, further comprising:
a second conductive via located in the interconnect region and coupled with logic circuitry below the interconnect region.

19. The apparatus of claim 18, wherein the conductive via is at least partially surrounded by a second dielectric material configured to isolate the conductive via from an access line segment.

20. The apparatus of claim 17, further comprising:
a plurality of access line segments in the interconnect region, each access line segment of the plurality configured to electrically float and at least one access line segment of the plurality in contact with a boundary region of the plurality.

* * * * *